United States Patent [19]

Grimsland

[11] Patent Number: 4,544,883
[45] Date of Patent: Oct. 1, 1985

[54] METHOD AND DEVICE FOR RAPIDLY MEASURING FREQUENCY RESPONSE OF ELECTRONIC TEST OBJECTS

[76] Inventor: Michael Grimsland, Lagavagen 31, S-121 59 Johanneshov, Sweden

[21] Appl. No.: 533,919

[22] Filed: Sep. 20, 1983

[30] Foreign Application Priority Data

Sep. 21, 1982 [SE] Sweden .................................. 8205399

[51] Int. Cl.⁴ ..................... G01R 27/00; G01R 27/02; G01R 23/16
[52] U.S. Cl. ............................... 324/77 CS; 324/57 SS
[58] Field of Search ................. 324/57 SS, 57 Q, 78 J, 324/77 F, 77 C, 77 CS, 76 A, 78 E

[56] References Cited

U.S. PATENT DOCUMENTS

| 2,588,730 | 3/1952 | Johnson ....................... 324/57 SS X |
| 2,602,836 | 7/1952 | Foster . |
| 3,253,216 | 5/1966 | Feldman ....................... 324/57 SS X |
| 3,839,673 | 10/1974 | Acker . |
| 3,965,424 | 6/1976 | Coackley . |

OTHER PUBLICATIONS

Murthy: "An Integrated Circuit Frequency Meter'-'—*Med. & Biol. Engng.*—vol. 7, Sep. 1969, pp. 543–548.

*Primary Examiner*—Stanley T. Krawczewicz
*Assistant Examiner*—Jose M. Solis
*Attorney, Agent, or Firm*—Pollock, Vande Sande & Priddy

[57] ABSTRACT

The present invention relates to a method and a device for measuring and displaying the frequency response of a test object (1), such as an amplifier, tape recorder, whereby a known test signal (S) is transferred to the input of the test object (1) while the transmitted signal (U) is measured at the output of the test object, whereafter the measured frequency is displayed on a display means (2). According to the invention, the test signal (S) is comprised of a sine pulse train of different partial signals (D1, D2, D3, D4) with predetermined frequencies and with the same amplitudes. The different partial signals are detected at the output of the test object (1) by a completely independent detector unit (3) which continuously, within a whole or half period of the signal, reads the amplitude as well as the frequency. The frequency is detected by a frequency detector (4) comprised mainly of a zero passage detector (7) attached to a ramp function generator (8) and to a sample and hold circuit (9) to the input of which the output of the ramp function generator (8) is also attached. The amplitude is detected by a amplitude detector (5) comprised mainly of a full wave rectifier (14) attached to a peak-hold circuit (15). In addition, it is suitable, according to the invention, to have the output from the sample and hold circuit (9) and the output from the peak-hold circuit (15) attached to respective logarithmic amplifiers (10 respectively 16) which in turn are attached to the frequency, respectively amplitude, inputs, of the display means.

9 Claims, 3 Drawing Figures

METHOD AND DEVICE FOR RAPIDLY MEASURING FREQUENCY RESPONSE OF ELECTRONIC TEST OBJECTS

The present invention relates to a method for measuring the frequency response in a tape recorder, for instance electronic components, such as a tape recorder, by measuring the transmitted signal by feeding in a known signal, and a device for carrying out the method.

In various types of equipment it is often necessary to measure and possibly justify the frequency response, that is, the dependence of the amplification or attenuation on the frequency of the amplified, attenuated or transmitted signal. Some examples of such equipment are tape recorders, amplifiers, attenuators, cables, etc.

Today the frequency response in tape recorders is, as a rule, adjusted in such a way that a reference tape with recorded standard signals is played back whereby the transmitted signal is measured and noted, and then a graph of the frequency response is drawn. The first tone in the signal comprises the standard for the playback level. It has a frequency of 1000 Hz and a duration of 30 seconds, for instance. After this standardization signal comes a series of signals with frequencies from about 30 Hz to 20 kHz, usually with a duration of 10 seconds each. The level of the transmitted signal is recorded for every frequency, and if all the values are equal, the ideal has been reached, whereby it can be said that the frequency response is flat. Because this is not usually the case, the amplification for the different frequencies must be adjusted, whereby the tape as a rule must be played through a number of times, which can be rather time consuming.

A comparable frequency analysis is made for the recording of the tape recorder whereby the different frequencies are fed in from an external frequency generator. After recording, the recorded tones on the tape are checked in the same way as with the reference tapes as given above. If the recorded tape gives the same transmitted signal as the reference tape gave for the respective frequencies, the recording graph is straight.

SUMMARY OF THE INVENTION

The object of the invention is, therefore, to provide a device for measuring and adjusting frequency response which is considerably quicker and simpler and which thereby makes this type of measurement and adjustment significantly less expensive.

This invention solves the above problems whereby one measures and displays the frequency response of a test object, such as a tape recorder, directly on a display means such as an oscilloscope, x-y recorder, or in a data processed format such as tables, histograms or graphs.

According to the invention, the test signal, which constitutes the input signal to the test object, comprises a sine pulse train of different partial signals with similar amplitude and with predetermined frequencies, the partial signals being continuously detected to the output of the test object by a completely independent detector which, after each completed partial signal, emits an initial signal or voltage level representing the frequency of the transmitted signal as well as a second signal or voltage level representing the amplitude of the transmitted signal, the first and second, signal are fed into the named display means. A sine pulse train may be the test signal, comprising, partial signals with successively increasing frequencies, for example, 100 Hz, 200 Hz, 400 Hz, etc., and having an amplitude of 1 mV. The frequency and amplitude of the test object output signal produced in response to the partial signals. and feed to a display means in the form of, for example, an x/y deflected oscilloscope, one receives on the screen of the oscilloscope, a polygonal wave which shows the frequency response of the test object. With sequential repetition of the test signal without appreciable intervals a repeated drawing of the frequency response curve will appear on the screen of the oscilloscope.

In addition, according to the invention, the generation of the test signal can either occur with the help of an electronic test signal emitter or by receiving the playback signal of a tape on which the previous test signals hve been recorded, suitable for testing the frequency response of a tape recorder.

According to the invention, by permitting the signal at the output of the test object to be measured, both as to the frequency and amplitude, and to do it continuously and within the space of a half or whole period of the oscillation, the manner in which the test signal is composed is completely optional. It can have a continuously increasing or decreasing frequency, or have a randomly varying frequency, so long as the amplitude is constant and the frequency fluctuations do not occur with a skip in its derivative.

If, for instance, the test signal is comprised of a totally continuous pulse train of alternatively increasing and decreasing frequencies, the curve of the frequency will sweep to and fro between the highest and lowest frequency the entire time.

In contrast to the situation with known technology, the duration of the various partial frequency signals does not need to be long when using the method according to the present invention. The time of one frequency of the signal which, according to the invention, must be as short as a half period. Thus it is enough if the partial signal with a frequency of 200 Hz has a duration of 2.5 milliseconds. In this way a frequency sweep of the entire audible range can take place in as short a time as approximately one tenth of a second. However, there is nothing to prevent the duration of the partial signals to be longer.

In a device for carrying out the method according to the invention, the test signal is attached to the input of the test object while the output of the test object is attached to a detector unit comprised of a frequency detector and an amplitude detector the frequency and amplitude detectors are attached to a display means. The frequency and amplitude detectors measure simultaneously the response to each of the partial frequency signal in both frequency and amplitude.

The frequency detector is preferably comprised of a zero crossing detector connected to a ramp function generator, as well as to a sample and hold circuit, which also receives the output of the ramp function generator. The output of the sample and hold circuit can, for example, be attached to a logarithmic amplifier, the output of which is in turn received by the frequency input of the display means such as the x-input of an x/y recorder.

According to the invention it is also suitable for the amplitude detector which is attached to the output of the test object to be a full wave rectifier with the output attached to a peak-hold circuit the peak-hold circuit is connected to the input of a second logarithmic amplifier which has an output attached to the amplitude input of the display means, a zero crossing detector controls. The peak-hold circuit, the zero crossing detector can either be the zero crossing detector of the frequency detector or it can be a separate unit.

Where the amplitude of the transmitted signal of the test object varies greatly with the frequency, it is suitable for the zero crossing detector in the frequency detector to be attached to the output of the test object via a constant amplitude regulator. This reduces the risk of the zero crossing detection errors with accompanying frequency accountability errors.

According to the invention, it is suitable to produce the test signal with a test signal transmitter. This test signal transmitter can either be directly electrically connected to the input of the test object, or if the test object is a tape recorder, it could be made from a recorded tape.

DESCRIPTION OF THE FIGURES

The invention is described below in more detail with reference to the attached FIGS. 1-3, where.

DESCRIPTION OF THE PREFERRED EMBODIMENT

Figure 1:
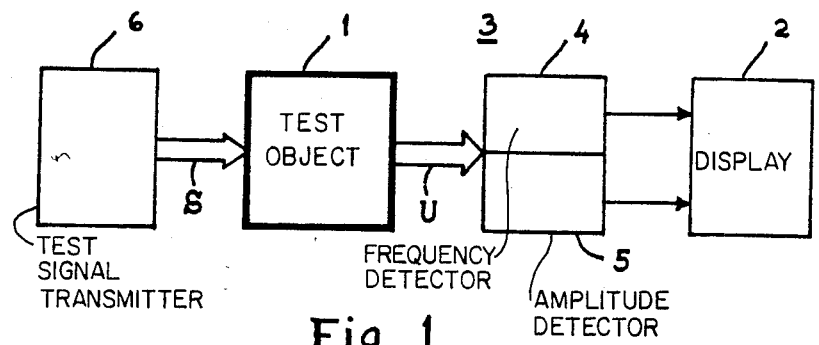
FIG. 1 shows a typical embodiment of the present invention in block diagram form.

In FIG. 1 the present invention is shown in block diagram form. A test object such as a transmission circuit, tape recorder, audio amplifier or similar device, with the symbol 1, has the input attached a test signal transmitter 6 and the output attached to a detector unit 3 which in turn is attached to a display means 2. The detector unit 3 includes two units: a frequency detector 4 and an amplitude detector 5. These two units instantly detect the frequency and the amplitude of the signal U at the output of the test object 1 and emit the test value to the display means 2 which, for example, draws a frequency curve or presents the frequency in the form of tables or diagrams. The conditions for the frequency/amplitude diagram to be correctly measured are that the signal fed into the test object has a constant amplitude independent of the frequency. This can easily be shown by attaching the output of the test signal transmitter 6 with the signal S directly to the input of the detector unit 3 and reading from the display means 2.

By not requiring any electrical or communications connection between the test signal transmitter and the detector unit with the display means 2, a frequency response curve can be measured very quickly despite the high number of test frequencies being used. Nor does the detector need to know anything about how the frequencies entering are arranged so long as they have the same amplitude.

Figure 2:
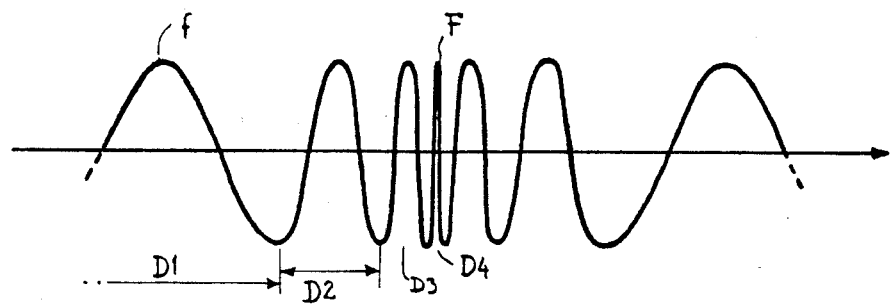
FIG. 2 shows the principle as to how, according to the invention, a test signal can be comprised.

FIG. 2 shows in principle how a typical test signal can be composed. In the example given, an entire period of each of the shown partial signals D1, D2, D3 and D4 has been chosen. However, in principle, as little as one half of a period of each partial signal can be used. Of course, there is no maximum limit to the length of the various partial signals. In FIG. 2 the frequency of the signal is allowed to fluctuate between a maximum value F and a minimum value f in continuously increasing, respective decreasing, sequences, but this is not a requirement. However, it is often practical to allow the frequency to sweep in that way.

Figure 3:
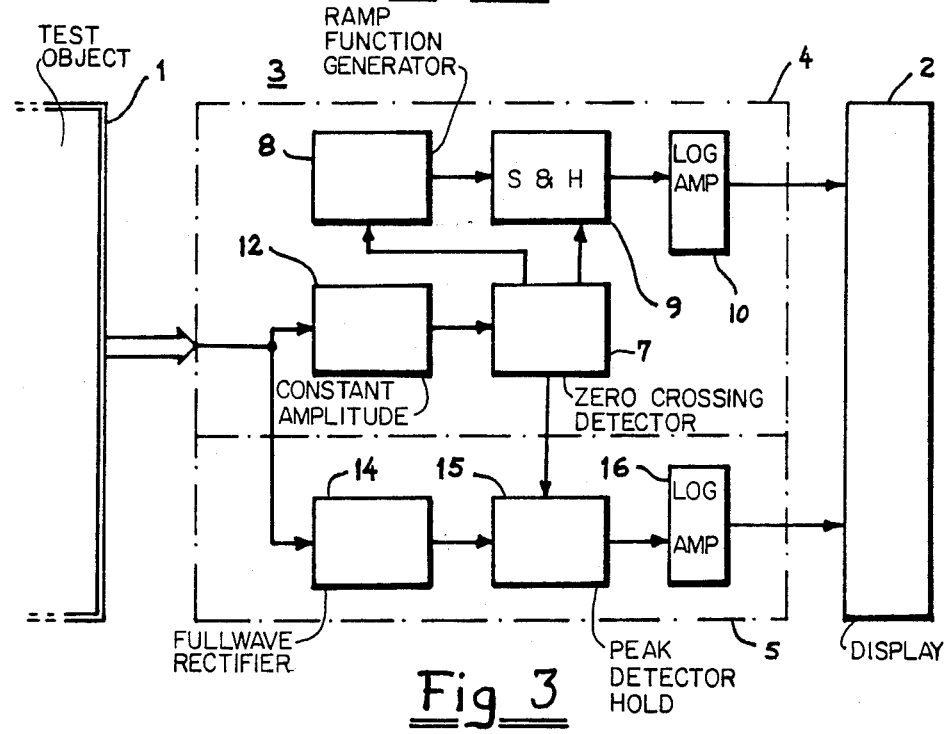
FIG. 3 shows how a device to carry out the method according to the present invention can be constructed.

FIG. 3 is a block diagram of an example of a device for carrying out the method according to the present invention. Specifically, shown is the detector unit 3, having amplitude detector 5 and the frequency detector 4, while the display means 2 and the test object 1 are only suggested. The test signal transmitter 6 is not shown at all.

The device in FIG. 3 shows the preferred construction of a frequency detector, with a signal input attached to the output of the test object 1. The signal input is connected to the input of a zero crossing detector 7 which can be preceded by a constant amplitude regulator 12. The output of the zero crossing detector 7 is attached to a trigger input on a ramp function generator 8, and to the trigger input on a sample and hold circuit 9. The output of the ramp function generator is in turn attached to the signal input of the sample and hold circuit 9. The function is such that when the signal from the test object reaches a zero value, the zero crossing detector 7 emits a trigger pulse which sets the ramp function generator 8 to zero and simultaneously initiates a new ramp. The value the ramp had when the trigger pulse from the zero crossing detector 7 was emitted is simultaneously read by using the sample and hold circuit 9 which simultaneously received a trigger signal initiating the process. The value read by the sample and hold circuit remains until a new trigger pulse from the zero crossing detector orders a new reading of the ramp function generator's instantaneous voltage value. During the time which passed between the two trigger pulse signals given by the zero crossing detector the voltage of the ramp has time to increase to a value which is directly proportional to the period of the signal from the test object 1, that is, inversely proportional to the frequency in the interval between the zero crossings.

The transmitted signal from the sample and hold circuit 9 is received by a logarithmic amplifier 10 which is attached to the frequency input of the display means 2.

The amplitude detector 5 shown in FIG. 3 is preferably comprised of a full wave rectifier 14 which receives the signal from the output of the test object 1. The output of the full wave rectifier is received by a peak-hold circuit 15, which, upon transmission, transmits a signal the same as the peak voltage which occurred at any moment since the previous zero setting. The zero setting of the peak-hold circuit 15 is attained with the help of the signal from the zero crossing detector, preferably the one in the frequency detector within the zero crossing detector 7. The signal from the peak-hold circuit 15 is fed into another logarithmic amplifier 16, the output of which is in turn attached to the amplitude input of the display means 2.

In a case where the display means 2 is comprised of an oscilloscope, a the X deflection control can be attached to the output of the frequency detector, and the y deflection control can be attached to the output of the amplitude detector. By sweeping the frequency of the test signal up and down between a minimum value f and a maximum value F, for example, ten times per second while the frequency response of the test object is adjusted, one can instantly see how the frequency response curve is altered with the adjustment. In addition to an oscilloscope, the detector circuit 3 can be attached to a plotter, printer or other similar unit which, when the adjustment is complete, presents a frequency diagram, tables, etc. It is even possible to use a conventional television receiver as a display means; this can be of special interest if the frequency of the sound portion of the receiver is to be set or tested.

In that one is not bound to a certain frequency step or to a certain order between the partial frequencies of the test signal, it is possible, for example, to, measure the frequency with greater frequency resolution in some regions than in other, perhaps less interesting, regions.

I claim:

1. A method for determining the frequency response of an electronic test object comprising:

supplying an input test signal to said electronic test object, said signal including a sine pulse train of partial signals of different, predetermined frequencies, said partial signals being not substantially more than a full period in duration;

detecting the frequency response of said test object to said input test signal by measuring independent of said input test signal said test object output signal, and providing a first signal representing the instantaneous frequency of a signal from said test object, and a second signal representing the amplitude of the signal from said test object; and supplying said first and second signals to a display means whereby an instantaneous indication of the level and frequency of a signal produced by said test object is obtained without synchronizing said display means with said input test signal.

2. A method according to claim 1, wherein the test signal comprises one or more sine pulse trains with changing frequencies and where every incoming partial signal comprises at least one-half a sine period of every respective frequency.

3. The method according to claim 1 wherein said test signal comprises a sine pulse train of different partial signals, each having different frequencies, said partial signals arranged in an order so that the sine pulse train changes in predetermined steps between a maximum and minimum frequency.

4. The method according to claim 3 wherein said sine pulse train alternately increases and decreases in frequency.

5. A method according to claim 3, wherein the sine pulse train is continuous without interruption and transistions between the partial signals occurs without discontinuities in the time derivative of the sine pulse train.

6. An apparatus for measuring and displaying the frequency response of an electronic test object comprising:

a test signal generator for supplying a test signal to the input of said electronic test object, said test signal including a plurality of partial signals of different frequencies, each partial signal having not substantially more than a full period;

a detector for receiving a signal from the output of said test object, and measuring the frequency and amplitude of said test object output signal independent of said test signal generator, and providing first and second signals representing the instantaneous frequency and amplitude of said output signal; and a display means for generating from each of said first and second signals a representation of the amplitude and frequency of said output signal without synchronizing said display means with said test signal generator.

7. The apparatus according to claim 6 wherein said detector includes a frequency detector for generating said first signal, and an amplitude detector for generating said second signal, said frequency detector comprising:

a zero crossing detector for receiving said test object output signal;

a ramp generator connected to said zero crossing detector whereby a ramp signal is generated for each signal transition detected by said zero crossing detector;

a sample and hold circuit connected to said ramp generator and said zero crossing detector for providing a sampled level of said ramp signal;

a logarithmic amplifier circuit connected to the sample and hold circuit;

said logarithmic amplifier circuit providing said first signal representing the sampled magnitude of said ramp signal corresponding to the time between zero crossings detected of said output signal.

8. The apparatus of claim 7 further comprising a constant amplitude level regulator for maintaining the level of a signal received by said zero crossing detector substantially constant.

9. The apparatus according to claim 6 wherein said detector includes an amplitude detector for providing said second signal comprising:

a zero crossing detector for receiving said output signal;

a full wave rectifier for receiving said output signal;

a peak detector connected to receive a signal from said full wave rectifier, and connected to be reset by said zero crossing detector;

a logarithmic amplifier connected to receive a peak signal from said peak detector;

whereby said logarithmic amplifier will provide said second signal proportional to the amplitude of said output signal between zero crossing detections of said output signal.

* * * * *